US006620708B1

United States Patent
Choi

(10) Patent No.: US 6,620,708 B1
(45) Date of Patent: Sep. 16, 2003

(54) METHOD FOR FABRICATING A SEMICONDUCTOR DEVICE UTILIZING HEMISPHERICAL GRAIN SILICON AND DOPING TO INCREASE CAPACITANCE

(75) Inventor: Hong Goo Choi, Seoul (KR)

(73) Assignee: Hynix Semiconductor, Kyoungki-do (KR)

( * ) Notice: Subject to any disclaimer, the term of this patent is extended or adjusted under 35 U.S.C. 154(b) by 0 days.

(21) Appl. No.: 09/723,244

(22) Filed: Nov. 28, 2000

(30) Foreign Application Priority Data

Jul. 19, 2000 (KR) ........................................ 2000/41370

(51) Int. Cl.[7] ........................ H01L 21/20; H01L 21/04
(52) U.S. Cl. ........................ 438/478; 438/510; 257/607
(58) Field of Search .............................. 438/506, 511, 438/433, 447, 914, 924, 478, 479, 488, 491, 510; 257/607, 618

(56) References Cited

U.S. PATENT DOCUMENTS 5,623,243 A * 4/1997 Watanabe et al. ........... 257/309
6,013,549 A * 1/2000 Han et al. .................... 438/253
6,046,082 A * 4/2000 Hirota ......................... 438/255
6,124,166 A   9/2000 Wang et al.
6,211,077 B1 * 4/2001 Shimizu et al. .............. 438/665
6,323,511 B1 * 11/2001 Marsh ......................... 257/295
6,403,407 B1 * 6/2002 Andry et al. ................. 438/158

* cited by examiner

Primary Examiner—Kamand Cuneo
Assistant Examiner—Scott B. Geyer
(74) Attorney, Agent, or Firm—Birch, Stewart, Kolasch & Birch, LLP

(57) ABSTRACT

A semiconductor device and method for fabricating a semiconductor device yields improved doping efficiency and increased capacitance. The method includes forming a silicon film on a substrate. HSG having a spherical projection forms on a surface of the silicon film. The surface of the silicon film having the HSG is washed, and a lower electrode forms by a doping process. A dielectric film and an upper electrode are sequentially formed on the silicon film without washing.

26 Claims, 5 Drawing Sheets

METHOD FOR FABRICATING A SEMICONDUCTOR DEVICE UTILIZING HEMISPHERICAL GRAIN SILICON AND DOPING TO INCREASE CAPACITANCE

BACKGROUND OF THE INVENTION

1. Field of the Invention

The invention relates to a semiconductor device, and more particularly, to a method for fabricating a semiconductor device, which improves doping efficiency to increase capacitance.

2. Background of the Related Art

Generally, a semiconductor device utilizes hemispherical grain (HSG) formation to increase capacitance. However, the HSG is only formed on silicon (Si) which is not completely doped. Accordingly, additional doping is required after the HSG is formed. Performing the additional doping uses either rapid thermal chemical vapor deposition (RTCVD) equipment or a furnace.

A related art method for fabricating a semiconductor device is described in FIGS. 1A to 1E, which are sectional views showing related art fabricating process steps of a semiconductor device.

FIG. 1A shows a silicon film 12 having low doping density deposited on a semiconductor substrate or an insulating film 11.

FIG. 1B shows annealing performed under high temperature and high vacuum to move or rearrange the silicon atoms of the silicon film 12, so that an HSG 12a having a spherical projection is formed. During the annealing process, if the doping density of the silicon film 12 is greater than a certain value, the crystallization energy barrier of the silicon becomes lower due to the presence of dopants doped on the silicon film 12. For this reason, the silicon crystallizes prematurely. This premature crystallization prevents the silicon atoms from moving smoothly to form the HSG structure. As a result, bald defects occur when forming the HSG 12a. Accordingly, it is necessary to control the silicon film 12 to have low density.

Subsequently, as shown in FIG. 1B, an oxide film and particles formed on a surface of the silicon film 12 are removed using a washing solution. Any one of $SC_1$ solution, HF solution, and a mixing solution of $SC_1$ and HF is used as the washing solution. $SC_1$ solution is composed of an ammonia solution, oxygenated water and $H_2O$.

FIG. 1C shows impurities doped on the silicon film 12 on which the HSG 12a is formed using RTCVD equipment or a furnace, so that a lower electrode 12b (shown in FIG. 1E) is formed. At this time, the doping process is performed at temperatures between about 700° C. and 950° C. in an atmosphere of $PH_3$ or $POCl_3$ gas.

Afterwards, as shown in FIG. 1D, the surface of the silicon film 12 is washed again using any one of a $SC_1$ solution, a HF solution or a mixture of $SC_1$ and HF solutions, to remove the oxide film and organic materials.

FIG. 1E shows a dielectric film 13 is formed on the lower electrode 12b. Any one of oxide-nitride-oxide (ONO) film, nitride-oxide (NO) film and $Ta_2O_5$ film is used as the dielectric film 13. Finally, an upper electrode 14 is formed on the dielectric film 13, so that the related art semiconductor device is completed.

The related art methods for fabricating a semiconductor device have problems, which reduce the quality of the finished device and increase production costs. Manufacturing difficulties arise from the washing process being performed both before and after the doping process to remove the oxide film and the organic materials. As a result, doping efficiency is remarkably reduced, thereby reducing the capacitance. This reduced capacitance is also related to the reduced surface area of the silicon film arising from the imperfections in the HSG structure.

Additional disadvantages arise from the multiple washing steps using aggressive solvent solutions such as HF solution and $SC_1$. These solutions are expensive to buy and maintain sufficiently pure and particle-free for semiconductor manufacturing. These aggressive solvents also pose hazards to the clean room personnel. As a result, a process improvement that eliminates a washing step reaps economic benefits through lower production costs and enhanced worker safety.

SUMMARY OF THE INVENTION

The invention, in part, provides a method for fabricating a semiconductor device that substantially eliminates one or more of the problems due to limitations and disadvantages of the related art.

The invention, in part, provides a method for fabricating a semiconductor device that improves doping efficiency to increase the capacitance.

The invention, in part, provides a method for fabricating a semiconductor device that eliminates at least one washing step with an aggressive solvent.

The invention, in part, provides a method for semiconductor fabrication that provides an improved HSG structure.

The invention, in part, provides a method of semiconductor fabrication which includes the steps of forming a silicon film on a semiconductor substrate, forming an HSG having a spherical projection on a surface of the silicon film, removing any debris by washing the surface of the silicon film on which the HSG is formed, forming a lower electrode by increasing the density of impurities of the silicon film by a doping process, and sequentially forming a dielectric film and an upper electrode on the silicon film, in which the density of the impurities is increased, without any washing process.

The invention, in part, provides a semiconductor device made according to the method of the invention.

Advantages of the present invention will become more apparent from the detailed description given herein after. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The accompanying drawings are included to provide a further understanding of the invention. The drawings illustrate embodiments of the invention and together with the description serve to explain the principles of the embodiments of the invention.

DETAILED DESCRIPTION OF PREFERRED EMBODIMENTS

Advantages of the present invention will become more apparent from the detailed description given herein after. However, it should be understood that the detailed description and specific examples, while indicating preferred embodiments of the invention, are given by way of illustration only, since various changes and modifications within the spirit and scope of the invention will become apparent to those skilled in the art from this detailed description.

Figure 1A:
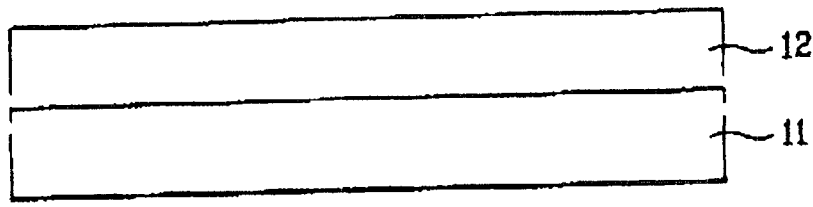
FIG. 1A shows a sectional view of a silicon film formed on a semiconductor substrate according to the related art.
Figure 1B:
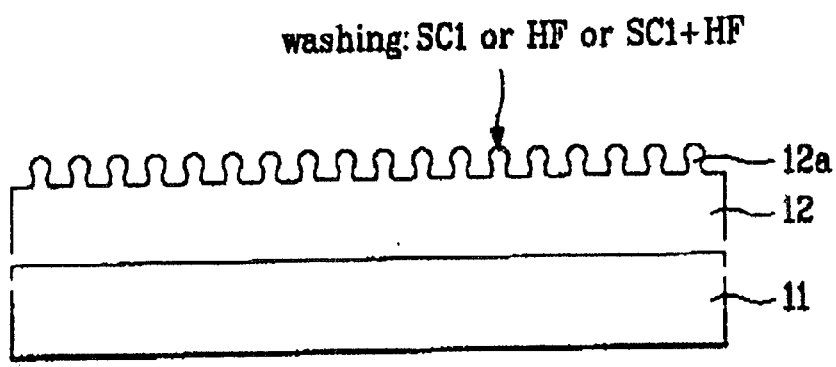
FIG. 1B shows a sectional view of washing a silicon film formed on a semiconductor substrate according to the related art.
Figure 1C:
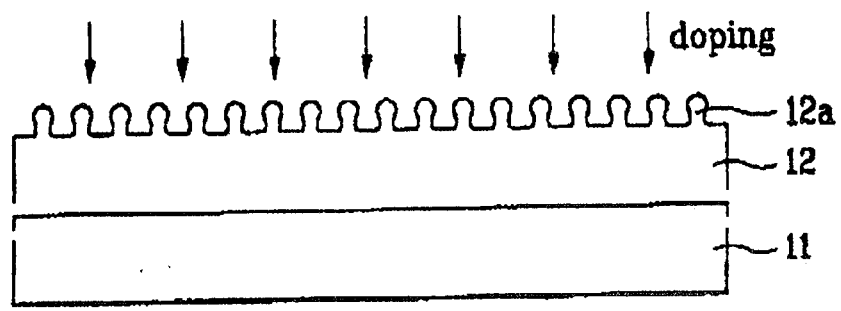
FIG. 1C shows a sectional view of doping a silicon film formed on a semiconductor substrate according to the related art.
Figure 1D:
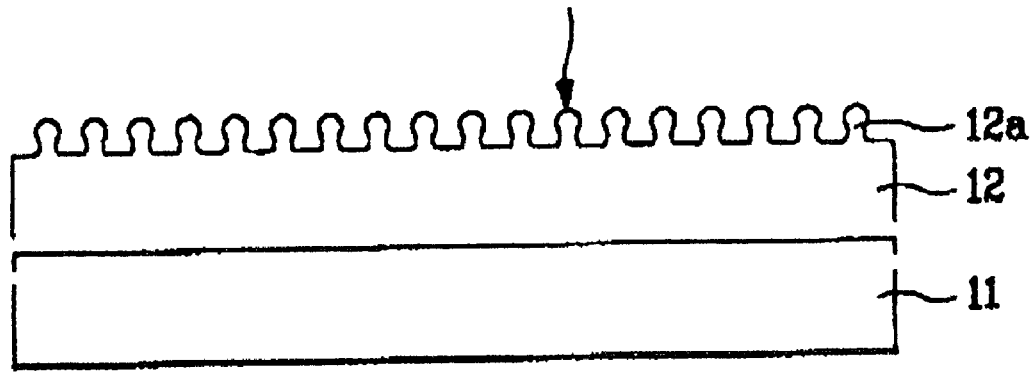
FIG. 1D shows a sectional view of washing a silicon film formed on a semiconductor substrate according to the related art.
Figure 1E:
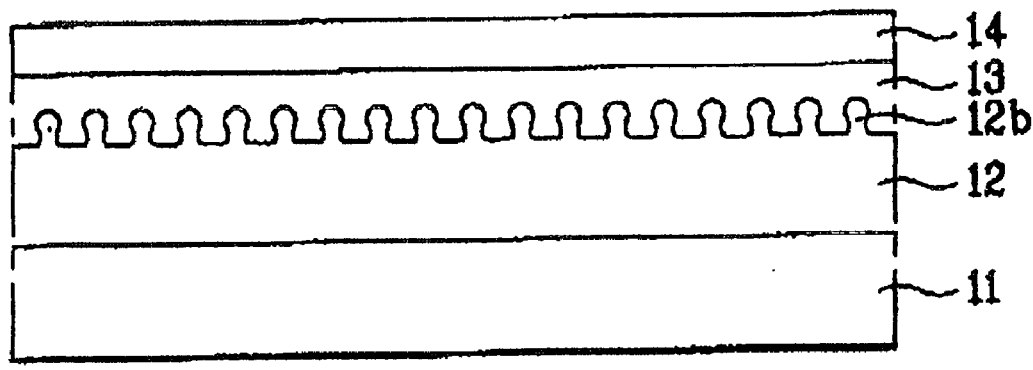
FIG. 1E shows a sectional view of a dielectric film formed on a lower electrode according to the related art.
Figure 2A:
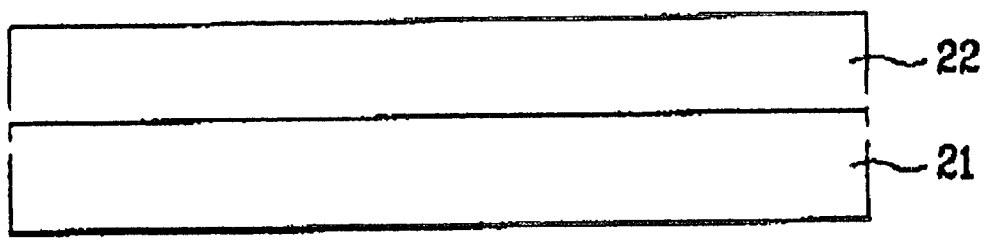
FIG. 2A shows a sectional view of a silicon film formed on a semiconductor substrate according to the invention.

FIG. 2A shows a silicon film 22 having low doping density deposited on a semiconductor substrate or an insulating film 21.

Figure 2B:
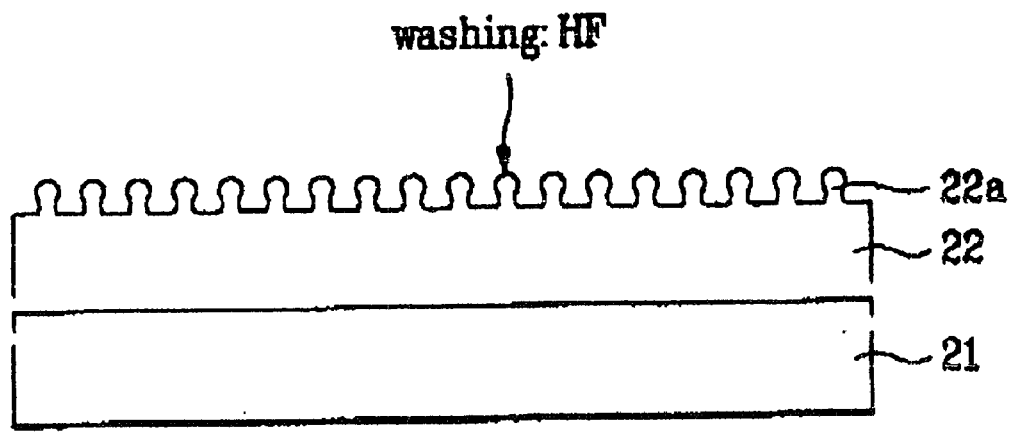
FIG. 2B shows a sectional view of washing a silicon film formed on a semiconductor substrate according to the invention.

FIG. 2B shows annealing performed under high temperature and high vacuum to move silicon atoms of the silicon film 22, so that an HSG 22a having spherical projections is formed. At this time, if the doping density of the silicon film 22 is greater than a certain value, a crystallization energy barrier of the silicon becomes lower caused by dopants doped on the silicon film 22. For this reason, the silicon prematurely crystallizes. This premature crystallization prevents the silicon atoms from moving smoothly. As a result of the imperfect migration of Si, bald defects occur when forming the HSG 22a. Accordingly, the silicon film 22 must be controlled to have low density.

Subsequently, as shown in FIG. 2B, the silicon film 22 is washed to remove an oxide film and organic materials on a surface of the silicon film 22 on which the HSG 22a is formed. At this time, a solution or gas containing HF is used as a washing solution or cleaning medium so that additional dopants are injected into the silicon film 22.

Figure 2C:
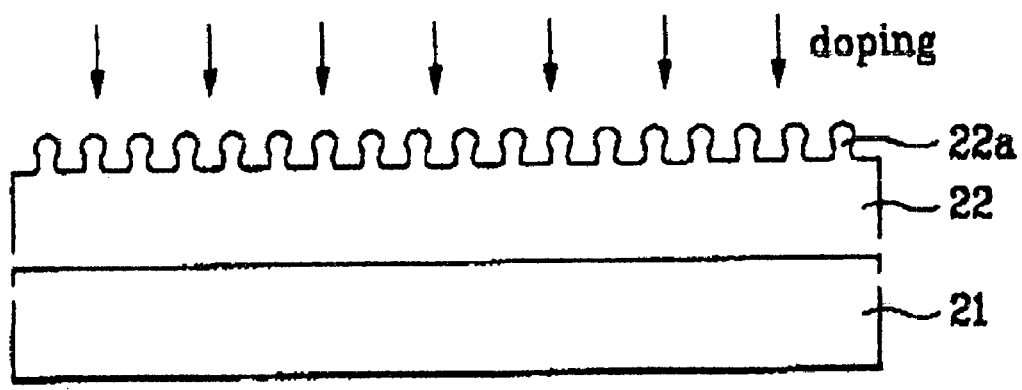
FIG. 2C shows a sectional view of doping a silicon film formed on a semiconductor substrate according to the invention.

FIG. 2C shows impurities are doped on the silicon film 22 on which the HSG 22a is formed, using RTCVD equipment or a furnace, so that the silicon film 22 forms a lower electrode 22b. At this time, the doping process is performed at a temperature between 700° C. and 950° C. in an ambient atmosphere of $PH_3$ or $POCl_3$ gas.

Figure 2D:
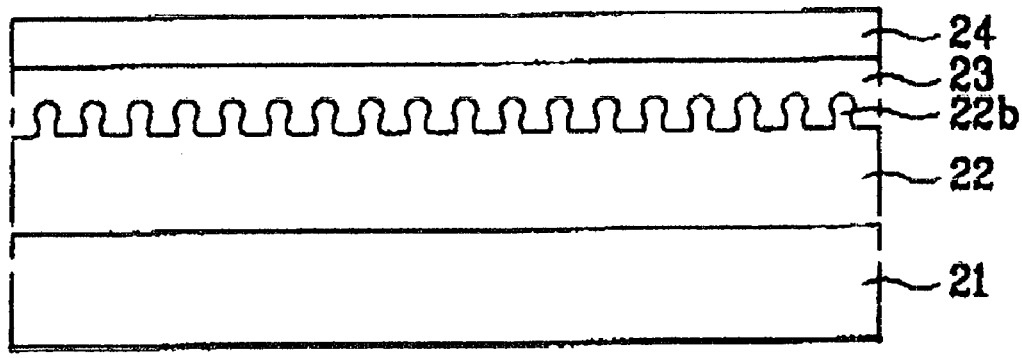
FIG. 2D shows a sectional view of a dielectric film formed on a substrate according to the invention.

Afterwards, as shown in FIG. 2D, a dielectric film 23 is formed on the lower electrode 22b. Any one of ONO film, NO film, $Ta_2O_5$ film, $Al_2O_3$ film, and $TiO_2$ film can be used as the dielectric film 23.

When a NO film or ONO film is used as the dielectric film 23, ammonia gas is used when forming a nitride film. Also, a doping process for forming the lower electrode 22b and a nitrifying process for forming a nitride film are successively performed using the same equipment.

Meanwhile, in case where the $Ta_2O_5$ film forms the dielectric film 23, the $Ta_2O_5$ film is deposited on the lower electrode 22b in one process step. Alternately, the $Ta_2O_5$ film is formed by an oxidation process after a Ta film is formed.

When the $Al_2O_3$ film is formed as the dielectric film 23, the $Al_2O_3$ film is directly deposited on the lower electrode 22b in one process step. Alternately, the $Al_2O_3$ film is formed by oxidation process after an Al film is formed.

Finally, when a $TiO_2$ film forms the dielectric film 23, the $TiO_2$ film is directly deposited on the lower electrode 22b in one process step. Alternately, the $TiO_2$ film is formed by an oxidation process after a Ti film is formed. Afterwards, an upper electrode 24 is formed on the dielectric film 23, so that a semiconductor device is completed. Also, this process can be used as the basis for forming more complicated semiconductor devices. The process can also be performed multiple times in the production of a single semiconductor device.

Figure 3A:
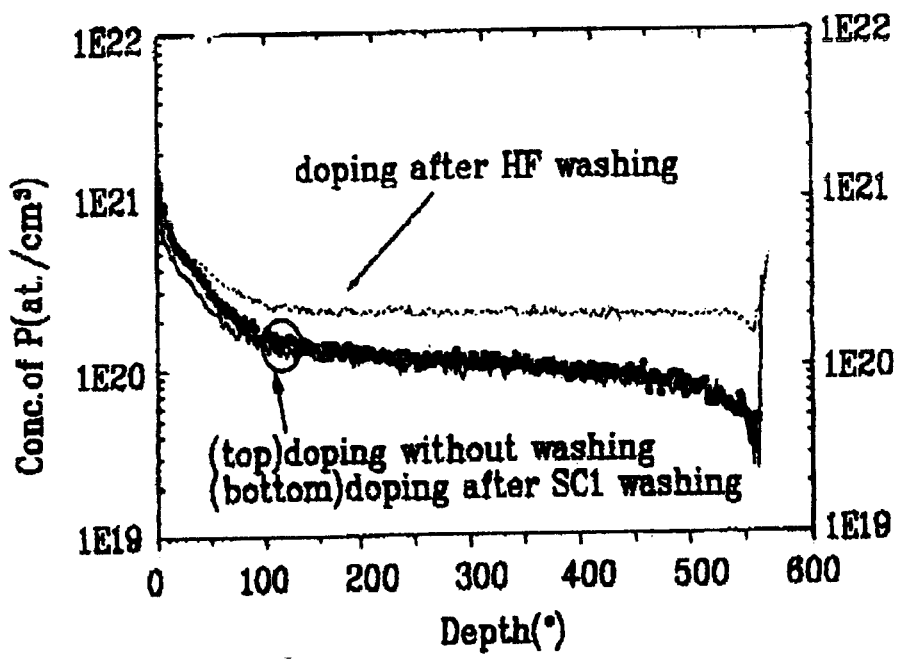
FIG. 3A shows secondary ion mass spectroscopy (SIMS) data results of doping density corresponding on a depth depending on a washing process.
Figure 3B:
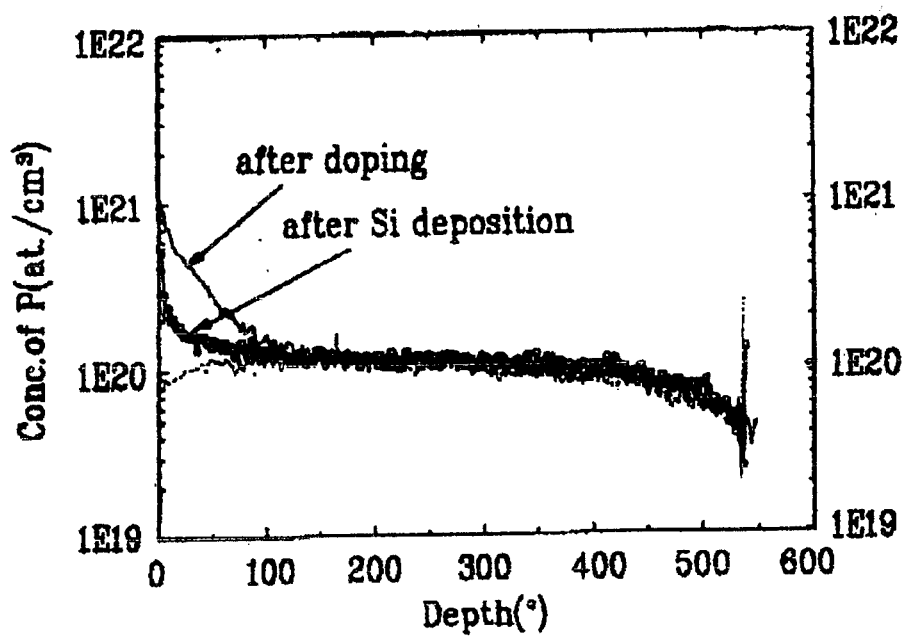
FIG. 3B shows secondary ion mass spectroscopy (SIMS) data results of doping density after doping and after Si deposition.

FIGS. 3A and 3B show SIMS (secondary ion mass spectroscopy) data of results for doping density as a function of depth depending on the washing process.

FIG. 3A shows the doping density before and after the washing process is performed. When a HF wash is used the doping density is greater than when the washing process is performed using $SC_1$. The HF wash can be performed using either HF gas or HF solution.

Moreover, as shown in FIG. 3B, when the doping process is performed on low-density silicon, the doping density increases. Additionally, the density of surface dopants undergoes a remarkable reduction if the washing process is formed after the doping process. Accordingly, the doping efficiency improves when the washing process using HF is performed before the doping process, and the washing process is not performed after the doping process.

As has been shown, the method for fabricating a semiconductor device according to the invention has the many advantages.

First, since the dopants can easily be injected into the silicon by removing the oxide film on the surface of the silicon using HF before the doping process, the doping efficiency can be improved.

Second, since the washing process is not performed after the doping process, the amount of the surface dopants can be maintained without any change. This also improves the doping efficiency.

Third, since the density of the surface dopant is high, depletion of the dopants can be reduced. This increases the capacitance.

Fourth, since the washing process is not performed after the doping process, the process steps can be simplified.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. It is to be understood that the foregoing descriptions and specific embodiments shown herein are merely illustrative of the best mode of the invention and the principles thereof, which is therefore understood to be limited only by the scope of the appended claims.

What is claimed is:

1. A method for fabricating a semiconductor device comprising the steps of:
    forming a silicon film on a substrate;
    forming an HSG on a surface of the silicon film;
    washing the surface of the silicon film on which the HSG is formed, to remove debris; and
    forming a lower electrode by increasing the density of impurities of the silicon film by a doping process, wherein the lower electrode is not washed.

2. The method of claim 1, which further comprises: sequentially forming a dielectric film and an upper electrode on the lower electrode.

3. The method of claim 2, wherein the dielectric film is selected from the group consisting of oxide-nitride-oxide (ONO) film, nitride-oxide(NO) film, $Ta_2O_5$ film, $Al_2O_3$ film, and $TiO_2$ film.

4. The method of claim 3, wherein the $Ta_2O_5$ film is deposited on the lower electrode in one process step, or the $Ta_2O_5$ film is formed by oxidation after a Ta film is formed.

5. The method of claim 3, wherein the $Al_2O_3$ film is deposited on the lower electrode in one process step, or the $Al_2O_3$ film is formed by oxidation process after an Al film is formed.

6. The method of claim 3, wherein the $TiO_2$ film is deposited on the lower electrode in one process step, or the $TiO_2$ film is formed by oxidation process after a Ti film is formed.

7. The method of claim 1, wherein the substrate is a semiconductor or an insulating film.

8. The method of claim 1, wherein the washing step is performed using a solution or gas containing HF.

9. The method of claim 1, wherein an oxide film on the surface of the silicon film is removed during the washing step.

10. The method of claim 1, wherein the doping process of the silicon film is performed at a temperature between about 700° C. and 950° C.

11. The method of claim 1, wherein the doping process of the silicon film is performed using $PH_3$ or $POCl_3$.

12. The method of claim 1, wherein not washing the lower electrode increases doping efficiency.

13. The method of claim 1, wherein not washing the lower electrode maintains an amount of surface dopants.

14. The method of claim 1, wherein not washing the lower electrode reduces dopant depletion so that capacitance increases.

15. A method for fabricating a semiconductor device comprising the steps of:

forming a silicon film on a substrate;

forming an HSG on a surface of the silicon film;

washing the surface of the silicon film on which the HSG is formed, to remove debris; and forming a lower electrode by increasing the density of impurities of the silicon film by a doping process, wherein the doping process of the silicon film is performed using RTCVD equipment or a furnace, and the lower electrode is not washed.

16. A method for fabricating a semiconductor device comprising the steps of:

forming a silicon film on a substrate;

forming an HSG on a surface of the silicon film;

washing the surface of the silicon film on which the HSG is formed, to remove debris;

forming a lower electrode by increasing the density of impurities of the silicon film by a doping process, wherein the lower electrode is not washed; and sequentially forming a dielectric film and an upper electrode on the lower electrode, the dielectric film being formed from a material selected from the group consisting of oxide-nitride-oxide(ONO) film, nitride-oxide (NO) film, $Ta_2O_5$ film, $Al_2O_3$ film, and $TiO_2$ film, wherein ammonia gas is used when forming the nitride when the NO film or the ONO film is used as the dielectric film.

17. A method for fabricating a semiconductor device comprising the steps of:

forming a silicon film on a substrate;

forming an HSG on a surface of the silicon film;

washing the surface of the silicon film on which the HSG is formed, to remove debris;

forming a lower electrode by increasing the density of impurities of the silicon film by a doping process, wherein the lower electrode is not washed; and sequentially forming a dielectric film and an upper electrode on the lower electrode, the dielectric film being formed from a material selected from the group consisting of oxide-nitride-oxide(ONO) film, nitride-oxide (NO) film, $Ta_2O_5$ film, $Al_2O_3$ film, and $TiO_2$ film, wherein the doping process for forming the lower electrode and a nitrifying process for forming a nitride film are successively performed using the same equipment when the NO film or the ONO film is formed as the dielectric film.

18. A semiconductor device which comprises:

a substrate;

a silicon film formed on the substrate; and an HSG formed on a surface of the silicon film, the surface of the silicon film having been washed to remove debris, the silicon film being formed into a lower electrode by increasing the density of impurities of the silicon film by doping, wherein the lower electrode is not washed.

19. The semiconductor device of claim 18, which further comprises:

a dielectric film formed on the lower electrode; and an upper electrode formed on the dielectric film.

20. The semiconductor device of claim 19, wherein the dielectric film is selected from the group consisting of oxide-nitride-oxide (ONO) film, nitride-oxide (NO) film and $Ta_2O_5$ film, $Al_2O_3$ film, and $TiO_2$ film.

21. The semiconductor device of claim 18, wherein the substrate is a semiconductor or an insulating film.

22. The semiconductor device of claim 18, wherein the surface of the silicon film has been washed to remove debris using a solution or gas containing HF.

23. The device of claim 18, wherein not washing the lower electrode increases doping efficiency.

24. The device of claim 18, wherein not washing the lower electrode maintains an amount of surface dopants.

25. The device of claim 18, wherein hot washing the lower electrode reduces dopant depletion so that capacitance increases.

26. A semiconductor device which comprises:

a substrate;

a silicon film formed on the substrate; and an HSG formed on a surface of the silicon film, the surface of the silicon film having been washed to remove debris, the silicon film being formed into a lower electrode by increasing the density of impurities of the silicon film by doping, wherein the silicon film has been doped at a temperature between about 700° C. and 950° C. using $PH_3$ or $POCl_3$, and the lower electrode is not washed.

* * * * *